(12) United States Patent
Burkhardt et al.

(10) Patent No.: US 9,466,514 B2
(45) Date of Patent: Oct. 11, 2016

(54) SYSTEM FOR THE HEAT TREATMENT OF SUBSTRATES, AND METHOD FOR DETECTING MEASUREMENT DATA IN SAID SYSTEM

(75) Inventors: Jochen Burkhardt, Berghulen (DE); Milo Gaggioli, Blaubeuren (DE)

(73) Assignee: Rehm Thermal Systems GmbH, Blaubeuren-Seissen (DE)

( * ) Notice: Subject to any disclaimer, the term of this patent is extended or adjusted under 35 U.S.C. 154(b) by 508 days.

(21) Appl. No.: 14/124,421

(22) PCT Filed: Jun. 6, 2012

(86) PCT No.: PCT/EP2012/002406
§ 371 (c)(1),
(2), (4) Date: Jan. 6, 2014

(87) PCT Pub. No.: WO2012/167922
PCT Pub. Date: Dec. 13, 2012

(65) Prior Publication Data
US 2014/0147798 A1 May 29, 2014

(30) Foreign Application Priority Data

Jun. 6, 2011 (DE) .................. 10 2011 077 005

(51) Int. Cl.
*H01L 21/67* (2006.01)
*H01L 21/68* (2006.01)
(Continued)

(52) U.S. Cl.
CPC ........... *H01L 21/67098* (2013.01); *F27B 9/40* (2013.01); *F27D 19/00* (2013.01); *F27D 21/0014* (2013.01); *H01L 21/67115* (2013.01); *H01L 21/67173* (2013.01);
(Continued)

(58) Field of Classification Search
CPC ................. H01L 21/67248; H01L 21/67748; H01L 21/68; H01L 21/681; F27B 9/40; F27D 19/00; F27D 21/0014
See application file for complete search history.

(56) References Cited

U.S. PATENT DOCUMENTS

| 4,807,144 A | 2/1989 | Joehlin et al. ............... 364/473 |
| 5,248,199 A | 9/1993 | Reading ......................... 374/11 |

(Continued)

FOREIGN PATENT DOCUMENTS

| CN | 101101859 | 1/2008 |
| DE | 4033181 | 4/1992 |

(Continued)

OTHER PUBLICATIONS

Chinese search and Office Action in corresponding application CN 2012800281305.

*Primary Examiner* — Crystal J Barnes-Bullock
(74) *Attorney, Agent, or Firm* — Fattibene and Fattibene LI; Paul A. Fattibene (57) ABSTRACT

The present invention relates to a device (100) for the heat treatment of substrates and to a method for recording measurement data in said device, where said device (100) comprises at least one heatable chamber (102), a carrier system (108), a sensor assembly (112), and an actuator (111) that is independent of the carrier system (108). The carrier system (108) is designed to carry substrates, whereas the sensor assembly (112) is further configured for coupling to a data recording and/or data storage device (130). The actuator (111) is coupled to the sensor assembly (112) and is configured to position the sensor assembly (112) within the heatable chamber (102).

23 Claims, 3 Drawing Sheets

(51) Int. Cl.
*F27B 9/40* (2006.01)
*F27D 19/00* (2006.01)
*F27D 21/00* (2006.01)
*H01L 21/677* (2006.01)

(52) U.S. Cl.
CPC .. *H01L 21/67248* (2013.01); *H01L 21/67253* (2013.01); *H01L 21/67745* (2013.01); *H01L 21/68* (2013.01); *H01L 21/681* (2013.01)

(56) References Cited

U.S. PATENT DOCUMENTS

| | | | |
|---|---|---|---|
| 5,399,018 A | 3/1995 | Hollander et al. | 374/121 |
| 6,084,174 A | 7/2000 | Hedengren et al. | 136/201 |
| 6,175,422 B1 | 1/2001 | Penn et al. | 358/1.1 |
| 6,180,867 B1 | 1/2001 | Hedengren et al. | 136/201 |
| 6,204,483 B1 | 3/2001 | Fair et al. | 219/388 |
| 6,224,934 B1 | 5/2001 | Hasei et al. | 427/10 |
| 6,236,021 B1 | 5/2001 | Fair et al. | 219/388 |
| 7,521,687 B2* | 4/2009 | Fuse | B82Y 10/00 174/50.61 |
| 7,575,431 B2 | 8/2009 | Endo et al. | 432/245 |
| 2004/0187904 A1 | 9/2004 | Krellner et al. | 136/213 |
| 2005/0134834 A1 | 6/2005 | Davis et al. | 356/72 |
| 2006/0169208 A1* | 8/2006 | Shinozaki | G03F 7/7075 118/715 |
| 2010/0267188 A1 | 10/2010 | Parks et al. | 438/87 |

FOREIGN PATENT DOCUMENTS

| | | |
|---|---|---|
| DE | 10017900 | 4/2000 |
| DE | 10325602 | 9/2004 |
| DE | 102006016677 | 10/2007 |
| DE | 102009003023 | 11/2010 |
| JP | 9-189613 | 7/1997 |
| JP | 11-74277 | 3/1999 |
| JP | 2000-138176 | 5/2000 |
| JP | 2001176949 A * | 6/2001 |

* cited by examiner

SYSTEM FOR THE HEAT TREATMENT OF SUBSTRATES, AND METHOD FOR DETECTING MEASUREMENT DATA IN SAID SYSTEM

This is a U.S. National Phase Application under U.S.C. 371 of International Application No. PCT/EP2012/002406, filed on 6 Jun. 2012, which claims priority to German Application No. DE 10 2011 077 005.4, filed on 6 Jun. 2011.

FIELD OF THE INVENTION

The invention relates to a device for the heat treatment of substrates and a method for recording measurement data in such a device.

BACKGROUND OF THE INVENTION

Heat treatment is used for many industrial processes. It is of high importance, in particular, in the semiconductor technology, such as when manufacturing photovoltaic cells.

When manufacturing solar cells, semiconductor wafers generally undergo three metallization processes: the metallization process for the bus bar, the aluminum rear side contact and the front side contact. Metallization processes are used for contacting the semiconductor wafer and contacts are produced to the doped regions of the semiconductor wafer.

The contacting process generally has three stages: In a first step, a metal-containing paste in the shape of the contact to be produced is applied onto the surface to be contacted, for example, using a printing method such as screen printing. In this manner, the contact can be formed as a contact grid or applied over full-surface onto the semiconductor wafer surface to be contacted. By adding organic solvents and binders being admixed to the pastes, it is thereby ensured that the contact pastes are viscous, at least during the application procedure.

In a second step, the paste applied to the semiconductor wafer is dried at temperatures of about 250° C. so that the solvent and binder contained in the paste evaporates.

In a third step, the semi-conductor wafers to be contacted are exposed to temperatures of 200 to 400° C. during which the remaining organic substances contained in the paste burn away without residue. This is followed by short sintering (of a few seconds) of the paste at temperatures of 600 to 1000° C. The actual formation of the contact between the semiconductor wafer and the metal paste is effected in this third step and electric conductivity of the contacts is formed during the sintering process.

It is to be observed when contacting semiconductor wafers, firstly, that the contact resistance between the semiconductor wafer and the contact should be low and, secondly, as in particular for solar cells, the smallest possible portion of the effective functional surface of the semiconductor wafer is covered by the contacts. This is especially true when manufacturing contacts for solar cells on the side facing the incident light, as these contacts shadow the semiconductor material due to reflection or absorption of the incident light.

The temperature profiles required during metallization are crucial for the solar cell quality and degree of efficiency to be achieved. In addition to the so-called longitudinal profiles reflecting the temperature-time-curve of the thermal process, so-called cross profiles represent the temperature distribution across the width of the thermal device. While the longitudinal profiles usually have a peak temperature distribution which can for Fast-Firing devices reach up to 1000° C. and represent the firing process, transverse profiles should reflect the most homogeneous possible distribution of temperature along the width of the thermal device. Recording a temperature distribution in vicinity around the peak can be of particular interest, or recording a temperature distribution within a measurement volume comprising the peak.

The firing process is usually performed within a continuous furnace having a plurality of heating zones and a cooling section. The semiconductor wafers are transported through the furnace lying on a metal link conveyor. The heating elements are typically arranged above and below the conveyor. For highly productive manufacturing processes, partially multi-lane continuous furnaces are used in drying and firings devices. A typical drying device can be composed of a combination of five infrared zones and one central convection zone. Within the individual heating zones, the temperature can be controlled independently of the other heating zones, whereby a predetermined temperature profile can be set within the device. It should be noted that the conveyor belt co-determines the temperature distribution within a continuous furnace due to its own thermal capacity.

The quality of a semiconductor wafer contacting is determined by the electrical and mechanical contact formation, where at the same time the semiconductor wafer may not be subjected to any damage. This is particularly important when contacting a solar cell front side, for which any damage can cause short circuits and thereby greatly impair the efficiency of the solar cell.

It is therefore of great importance to determine a temperature profile in the longitudinal as well as in the transverse direction of a furnace and/or a device and to adjust and respectively maintain a desired temperature distribution within the furnace or the device, respectively.

A method for temperature-controlled processing of semiconductor wafers is known from publication DE 103 25 602 B3 in which the temperature of a semiconductor wafer is measured contactlessly within a reaction chamber using a pyrometer. The pyrometer is firmly fixed outside the chamber and through an inspection window detects the radiation emitted by one side of the semiconductor wafer. By using this measuring method, only the temperature of one side of the semiconductor wafer can therefore be detected at one location predetermined by the inspection window. However, it is not possible to detect a temperature profile within the reaction chamber along arbitrary measuring points in a manner independent of the semiconductor wafers to be processed.

Document DE 10 2007 020 176 A1 discloses a measuring system for temperature profile measurement in continuous furnaces in which a temperature sensor with an impedance-matched sensor antenna is driven by a conveyor belt through the furnace. There are monitoring antennas located in a continuous furnace monitoring the temperature determined by the sensor and the position of the sensor.

According to another widespread technique, individual measurement wafers are sent through a continuous furnace. Thermocouples and data recording devices are usually used for temperature recording. The thermocouples are either contacted to a silicon wafer acting as a measurement wafer only by a mechanical preload or attached thereto using suitable adhesives. Contacting thermocouples to silicon wafers is commonly associated with problems, since silicon wafers are brittle and very thin (approx. 180 µm). Mechanical fixation by preloading bears the problem that it can easily be released at the high temperatures given in the devices.

Adhesives change the thermal capacity at the measuring location and can distort temperature measurement.

For determining a temperature distribution along the width of a silicon wafer, one thermocouple is not sufficient. Three thermocouples are frequently attached onto the silicon wafer and a detected temperature difference between the measuring locations of the individual thermocouples on the silicon wafer represents a measure for the homogeneity of the temperature distribution. Each individual thermocouple attached on the wafer during temperature detection produces an individual temperature profile with different variations in measurement. Calibration, however, is very complex and also difficult. Calibration is in daily practice usually dispensed with, so that the measurement results are subject to relatively large systematic errors.

Furthermore, the number of temperature profiles generated by the thermocouples is limited in that only a number of thermocouples depending on the width of the wafer can be attached on one wafer. Usually one to four thermocouples are attached on a wafer.

Silicon wafer exhibit varying reflection and absorption properties, in particular due to the antireflection coating. Locally differing reflection and absorption properties can significantly affect the measurements of the individual thermocouples.

In determining these temperature distributions, the same measuring wafer is commonly repeatedly placed on the transport system of the device and driven through the device by the transport system in order to obtain reproducible results. As silicon wafers fitted with thermocouples are used as a measurement wafer, the number of repeated measurements is limited by the life span of the silicon wafer. Due to the very high transport speeds of conveyor belts (4 to 6 meters per minute), there is the further risk that the measurement wafers can be easily damaged. It is also difficult to repeat the measurements in a reproducible manner.

However, not only the temperature profiles in devices for the heat treatment of substrates are of interest, but also other measurement data, for example, data representing flow behavior of convection flows or vibrations of the device. The knowledge of convection flows within furnaces is extremely important for setting predetermined temperature profiles, whereas determining vibrations can allow the risk of damage to the substrates due to shocks be detected at an early stage.

It is an object of the invention to provide a device for the heat treatment of substrates which overcomes the drawbacks of prior art when determining measurement data within these devices. It is additionally an object of the present invention to provide an efficient method for recording measurement data in such a device solving the problems of prior art.

SUMMARY OF THE INVENTION

This object is satisfied according to the invention by a device for the heat treatment of substrates, where the device comprises at least a heatable chamber, a carrier system being adapted to carry substrates and formed as a transport system, a sensor assembly being configured for coupling to a data recording and/or data storage device, and comprises an actuator that is independent of the carrier system and coupled to the sensor assembly and is configured to position the sensor assembly within the heatable chamber. Due to the device comprising an actuator configured to move and position a sensor assembly and a carrier system being independent thereof for carrying substrates, positioning the sensor assembly can be performed independently of the carrier system. The device thereby provides a measuring system which is independent of substrate processing and the measurement volume is not limited by a carrier system.

In a further advantageous embodiment, the heatable chamber is a continuous furnace. Loading times of the furnace can thereby be reduced in a simple manner and the output of the device can be increased.

According to a further advantageous embodiment, the device further comprises a control device which is configured for electro-mechanical control of the actuator, so that the sensor assembly can be moved and positioned along at least one predetermined travel path. The sensor assembly can thereby be automatically positioned in a predetermined manner, where reproducibility of positioning is at the same time improved.

According to a further advantageous embodiment, the at least one travel path extends along a direction which is oriented perpendicular to a direction of passage. It is thereby possible to record a cross profile using a single sensor.

According to a further advantageous embodiment, the travel path extends along a direction which is oriented parallel or antiparallel to a direction of passage. By having the travel path extend along or against a direction of passage, measurement data can be recorded along or against a direction of passage, such as, for example, a longitudinal profile of the temperature.

In a further advantageous embodiment, the control device is configured to continuously move the sensor assembly. Continuous positioning of the sensor assembly along a travel path can allow short-term recording of measurement data along the travel path. This can enable permanent status monitoring.

In a further advantageous embodiment, the control device is configured to move the sensor assembly stepwise. Measurement data can thereby be recorded at a discrete number of measuring locations by the sensor assembly. It is for example possible to record temperatures given at measuring locations after the sensor assembly is in thermal equilibrium with its environment. The sensor assembly can be positioned at measuring locations further remote form each other and measurement data can be recorded in a shorter time at measuring locations being further remote from each other. For example, the influence of the thermal capacity of the sensor assembly to a temperature measurement can be reduced.

According to a further advantageous embodiment, the carrier system is formed as a chain-guided transport system. This makes it possible to position the sensor assembly at measuring locations which are arranged above or below the carrier system, or even between the chains of the transport system, because no "shadowing" effect from the heat source in the chamber occurs.

According to a further advantageous embodiment, the actuator comprises a telescopically extendable device, at the one end of which the sensor assembly is arranged and which is connected to the actuator. Flexible and also reproducible positioning of the sensor assembly within the device is possible with the telescopically extendable device.

According to a further advantageous embodiment, the sensor assembly is disposed on a substrate formed of silicon or material having thermal properties similar to silicon. This embodiment allows the sensor assembly to record measurement data, such as temperatures, under conditions as given in the vicinity of substrates during heat treatment.

According to a further advantageous embodiment, the sensor assembly comprises at least one temperature sensor and/or at least one vibration sensor and/or at least one flow sensor and/or at least one light sensor. Vibration sensors allow vibrations within the device to be detected, flow sensors can be used to record convection flows within the device, and temperature sensors offer the possibility of recording temperature profiles within the device.

According to a further advantageous embodiment, the sensor assembly comprises a thermocouple. This provides the simplest possible design of the sensor assembly. As the sensor assembly comprises only one measuring point, measurement errors are small.

According to a further advantageous embodiment, the sensor assembly comprises a linear array of thermocouples. This configuration allows for faster recording of the temperature distribution in a measuring volume and an increase in resolution.

According to a further advantageous embodiment, the sensor assembly comprises a two-dimensional array of thermocouples in a plane. This configuration allows for shortened measuring time and an increase in resolution.

According to a further advantageous embodiment, a heat-resistant shielding body is arranged between the actuator and the sensor assembly. Providing a shielding body between the sensor assembly and the actuator makes it possible to protect the actuator from the temperatures to which the sensor assembly is exposed. This extends the life span of the device.

According to a further advantageous embodiment, the actuator is configured to rotate the sensor assembly about an axis. This allows flexible and precise positioning of the sensor assembly in a simple manner within the heatable chamber.

According to a further advantageous embodiment, the actuator comprises an XYZ linear positioning system. Providing an XYZ linear positioning system enables simple positioning of the sensor assembly within a volume. Accordingly, recording measurement data, for example, temperature distribution, is not limited to an area defined by the carrier system.

According to a further advantageous embodiment, the device further comprises an encoder that is configured to determine the position of the sensor assembly. By providing an encoder, a position of the sensor assembly can be determined relative to the heatable chamber. The encoder can be formed, for example, by markings made at the heatable chamber and/or to the control device and/or to the actuator. It is also possible that the encoder emits a directed signal and the position of the sensor assembly can be effected by run-time measurements of the signals. Furthermore, the encoder can be formed by a system comprising an emitter disposed in the vicinity of the sensor assembly and a receiver assembly surrounding the largest possible measuring volume.

According to a further advantageous embodiment, the actuator is disposed at an inlet and/or outlet of at least one heatable chamber. The sensor assembly can be move into the chamber or moved out of the chamber. This makes it possible, if necessary, to enter the sensor assembly into the chamber and to expose it to the temperatures prevailing in the chamber, whereas the sensor assembly is arranged outside the chamber as long as no measurements are necessary within the chamber. By having the sensor assembly not necessarily be permanently exposed to the high temperatures, the life span of the sensor assembly can be extended. Furthermore, a configuration of the actuator at an inlet and/or outlet of the heatable chamber has the advantage that it is easily accessible and does not need to be exposed to high temperatures.

According to an advantageous embodiment, the device represents a drying and/or firing device in a metallization device for the production of solar cells or a hybrid furnace. Since the quality of the solar cells is closely related to the temperature profiles prevailing in a drying and/or a firing device, the present device can in an extremely efficient manner improve metallization devices for the production of solar cells or known hybrid furnaces.

The above-mentioned measuring systems for recording measurement data have the advantage that the measuring systems are employable not only during a production stop, but can also be employed during production. Unacceptable stoppage can be avoided in the production of solar cells.

The above-described measuring systems have the advantage that measurements performed with them can be performed very quickly.

The above-described measuring systems have the advantage that they are very easy to calibrate.

The above-described measuring systems have the advantage that repeated measurements exhibit no large deviations in the measuring results.

The above-described measuring systems have the advantage that they can be positioned within a freely definable measuring volume and measurement data can be recorded within a freely definable measuring volume.

The above-described measuring systems have the advantage that they are very robust and have a long life span.

According to a further advantageous embodiment of the invention, a method is proposed for recording measurement data in a device according to one of the previously explained embodiments. The method comprises introducing substrates to be treated into the device, conveying the substrates along a direction of passage, and positioning the sensor assembly within the heatable chamber. In this, the sensor assembly is positioned along the direction of passage and/or transverse to the direction of passage. This method is particularly advantageous for obtaining measurement data, for example, temperature distributions within the heatable chamber, while simultaneously conveying substrates to be treated through the device.

According to a further advantageous embodiment, the sensor assembly is positioned along the direction of passage such that the sensor assembly is moved with the substrates to be conveyed along the direction of passage. This allows recording measurement data, for example, a temperature profile, at the height of the substrates in the longitudinal and/or transverse direction without having to interrupt conveyance of the substrates. Furthermore, it is thereby possible to record a distribution of measurement data within the heatable chamber during operation of the device. In particular carryover effects by the heat capacities of the substrates conveyed can be reliably detected since temperature and/or flow profiles are recordable during conveyance of the substrates. It is additionally possible to detect any deviation of measurement data from predetermined target data, even during operation and conveyance and to take appropriate corrective action.

According to a further advantageous embodiment, positioning the sensor assembly and reading out and/or recording at least one measurement signal provided by the sensor assembly is performed alternatingly. Stepwise positioning and reading out and/or recording measurement signals associated therewith makes it possible to record measurement data at measuring locations arising after a thermal equilibrium between the sensor assembly and the environment has been reached. It is thereby possible to take into account effects that are caused by the thermal capacity of the sensor assembly. Reading out and/or recording measurement signals can be performed at predetermined time intervals. These predetermined time intervals can depend on a desired accuracy of the recording of measurement data and/or on a desired duration of the recording of the measurement data and/or on the conveying speed of the substrates and/or on a distance between two directly adjacent conveyed substrates.

According to a further advantageous embodiment, the device is further controlled in dependency of at least one measurement signal provided by the sensor assembly. In this manner, for example, conveying can be interrupted in the event of a detected deviation of temperature data at least one measuring location within the heatable chamber from the predetermined target values. Temperature regulation within the heatable chamber can also be performed based on the recorded measurement signals provided by the sensor. It is possible to have the conveying speed controlled based on the measurement signals provided by the sensor assembly to compensate for carry-over effects created by conveyance. In the event of a detected temperature drop and/or a change of the flow profile at at least one position, for example, a conveying speed can be increased and/or a temperature can be regulated and/or a loading rate can be reduced. In the event of a detected temperature increase and/or a change of the flow profile at at least one position, for example, a conveying speed can be increased and/or a temperature can be regulated and/or a loading rate can be increased.

According to a further advantageous embodiment, a method comprises determining the position of the sensor assembly and storing position data of the sensor assembly in a non-volatile memory device. The position of the sensor assembly is thereby known and can not be lost, for example, due to breakdown of the system.

The above methods for recording measurement data also have the advantage that these methods are not only employable during production halt. Unacceptable stoppage can thereby be avoided in the production of solar cells.

The above-described methods have the advantage that they can record measured data very quickly.

The above-described measuring systems have the advantage that they are very easy to calibrate.

The above-described methods have the advantage that repeated measurements exhibit no large deviations in the measuring results.

The above-described methods have the advantage that they can position the sensor assembly within a freely definable measuring volume and measurement data can be recorded within a freely definable measuring volume.

DESCRIPTION OF THE FIGURES

Other features, advantageous embodiments and advantages of the present invention will become apparent from the appended claims and the following detailed description of illustrative embodiments, where reference is made to the following figures.

DETAILED DESCRIPTION OF EXEMPLARY EMBODIMENTS

Figure 1:
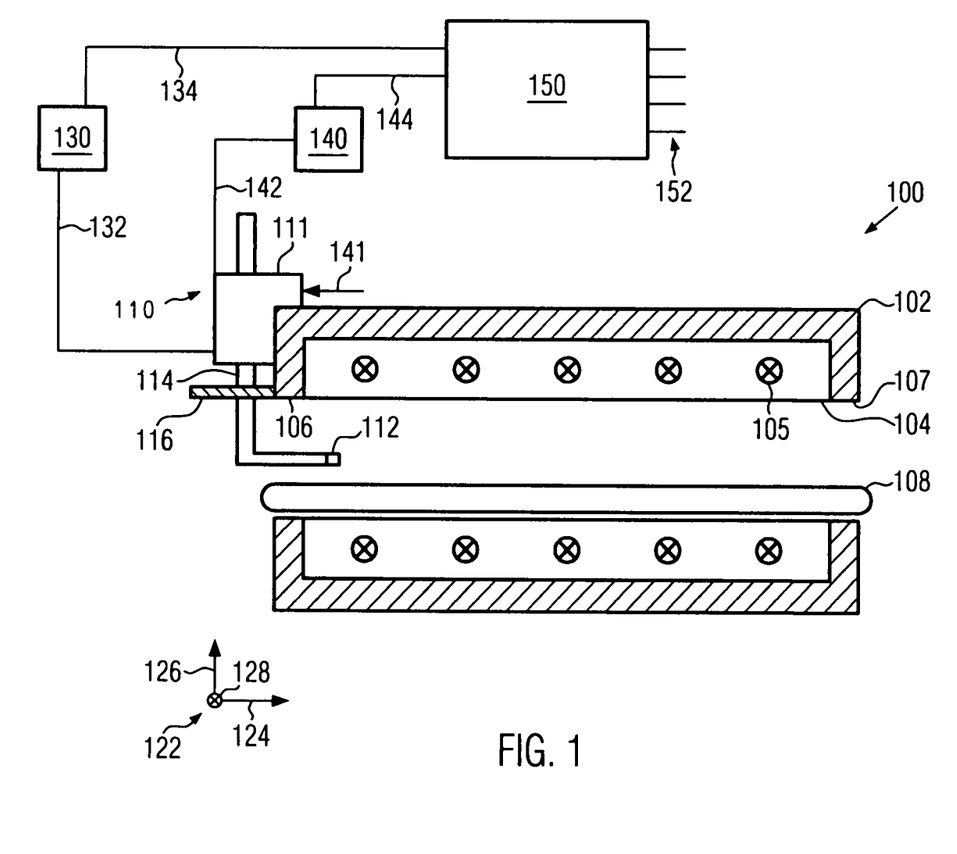
FIG. 1 shows a schematic cross-sectional view of an embodiment of a device for the heat treatment of substrates according to the present invention.

FIG. 1 shows a cross-sectional view of a device 100 for the heat treatment of substrates. The device 100 comprises a heatable chamber 102 that can be heated by a heating device 104. The heating device 104 can be disposed on an upper side and/or on an under side of the heatable chamber 102. Furthermore, the heatable chamber 102 comprises an inlet 106 and an outlet 107.

To heat the heatable chamber 102, the heating device 104 comprises heating elements 105, which can be formed by radiant heating devices emitting infrared radiation, for example, tungsten-halogen lamps, or other heat-generating radiators. The heating elements 105 can be controlled individually, so that temperature distribution within the heatable chamber 102 can be set in correspondence to a predetermined target temperature distribution. The heating device 104 can be shielded within the heatable chamber 102 by quartz glass. As a result, contamination of the heatable chamber 102 by the heating device 102 and in particular by the heating elements 105 can be avoided.

Within the heatable chamber 102, a carrier system 108 is arranged, via which the heatable chamber 102 can be loaded with substrates through the inlet 106. The carrier system 108 can be configured as a transport system, for example, as a mesh belt system, a metal chain system, a ceramic chain system, a lifting bar system, a Teflon belt system, a netting belt system or a pin chain system. The carrier system 108 can be configured for multi-lane operation. In this, the chamber 102 represents a continuous furnace, the direction of passage of which is oriented parallel to a direction 124 of a tripod 122. Here, the tripod 122 is oriented such that direction 124 and a direction 126 perpendicular thereto are in the plane of the paper of the illustration. A direction 128 being perpendicular to direction 124 and to direction 126 is directed into the plane of the paper. Direction 124 thereby represents a direction of passage of the device 100, direction 126 represents a height of the device 100, and direction 128 represents a width of the device 100.

The device 100 further comprises a measuring system 110. The measuring system 110 comprises an actuator 111 disposed at the upper side of the heatable chamber 102 at the inlet 106. Alternatively or additionally, the actuator 111 and/or at least one further actuator can be disposed at the upper side and/or at the under side of the heatable chamber 102 at the inlet 106 and/or at the outlet 107. A sensor assembly 112 is coupled to the actuator 111 by a linkage 114. The linkage 114 can be moved and positioned by the actuator 111 such that the sensor assembly 112 is arrangeable along the directions 124, 126 and 128 within the heatable chamber 102.

The sensor assembly 112 can be composed of at least one thermocouple, the cold junction of which is not illustrated. The sensor assembly 112 can comprise at least one type K and/or type N and/or type R and/or type S and/or type B thermocouple. Moreover, the sensor assembly 112 can be disposed on a substrate formed of silicon or a material having thermal properties similar to silicon. Respective sensor assemblies 112 being disposed on these substrates allow recording a temperature distribution along a positioning. This recorded temperature distributions therefore correspond to temperature distributions that arise on substrates conveyed through devices during the heat treatment. The at least one thermocouple can be disposed on silicon wafer fragments or pieces of material having thermal properties similar to silicon. When using multiple thermocouples, preferably thermocouples of the same kind can be used. The sensor assembly can additionally or alternatively also comprise other sensors, such as vibration sensors and/or flow sensors and/or light sensors.

Between the sensor assembly 112 and the actuator 111, a heat-resistant shielding body 116 is disposed at the inlet 106 and/or at the outlet 107 so that the actuator 111 is shielded from the high temperatures generated within the heatable chamber 102. The heat-resistant shielding body 116 can be made of heat-resistant material such as, for example, a metal. The heat-resistant shielding body 116 can further have a high thermal capacity and/or high thermal conductivity. The heat-resistant shielding body can also comprise a cooling by way of a coolant in order to ensure optimal shielding from high temperatures. The heat-resistant shielding body 116 can be formed of insulating material having a highly reflective surface, such as ceramic fiber material with a highly reflective surface.

A data recording and data storage device 130 records measurement signals from the sensor assembly 112 via a signal line 132 The data recording and data storage device can, for example, be a data logger or other suitable hardware and software. Furthermore, the data recording and storage device 130 can include a display device—not shown—such as a display, a screen or the like, to display the recorded data. For this, the data recording and storage device 130 can additionally comprise a data processing program that processes the recorded data for appropriate display by the display device.

The actuator 111 is controlled by a control device 140 which is connected via a signal line 142 to the actuator 111. Furthermore, it is possible to control the actuator 111 by suitable mechanical control devices 141, in addition to the control device 140, by an operator of the device 100. The mechanical device 141 can be configured, for example, as slides or cranks for manual operation of the actuator 111.

The control device 140 can comprise a carriage system—not shown—along which the actuator 111 can position and move the sensor assembly 112. The carriage system can be designed such that an operator of the device 100 effects positioning of the sensor assembly 112 by operating a switch or a mechanical device. For this, the carriage system can comprise a motorized drive system. Furthermore, the control device 140 can comprise a memory—not shown—in which data for predetermined travel paths can be stored along which the sensor assembly 112 can be positioned. Using this data, the control device 140 can actuate the actuator 111 in order to effect positioning of the sensor assembly 112. The control device 140 can also be transmitted data to actuate the actuator 111 in accordance with the data transmitted. Furthermore, the control device 140 can comprise an input device—not shown—via which an operator of the system 100 can enter data used for actuating the actuator 111 so that the sensor assembly 112 can be positioned and moved along the travel path according to the data entered.

Suitable hardware and software 150, which can be composed, for example, of a CPU and a suitable display device as well as storage media, controls the control device 140 via a signal line 144 and is connected via a signal line 134 to the data recording and data storage device 130. Via the signal line 134, the hardware and the software 150 reads out data recorded by the data recording and data storage device 130 which can be outputted via a display device by the software and the hardware 150.

Predetermined actuating programs can be stored in the hardware and the software 150 that can be transmitted to the control device 140 via the signal line 144. It is also possible to select actuating programs pre-stored in the control device 140 or have them selected by the hardware and software 150 which are outputted as control signals via the signal line 142 to the actuator 111. The actuator 111 is thereby controlled to perform a travel path, so that the sensor assembly 112 is positioned accordingly. Using the data recording and data storage device 130, the hardware and the software 150 record the measurement signals that are provided by the sensor assembly 112 along the positioning.

The hardware and the software 150 can also comprise input devices—not shown—such as a push button, a keyboard, a touch screen and/or the like.

Using lines and interfaces 152, data received, stored and displayed by the software and the hardware 150 can be provided which can be used, for example, for controlling the device 100 and/or can be transmitted to other devices. The lines and interfaces 152 can also provide additional connections to networks.

Figure 2:
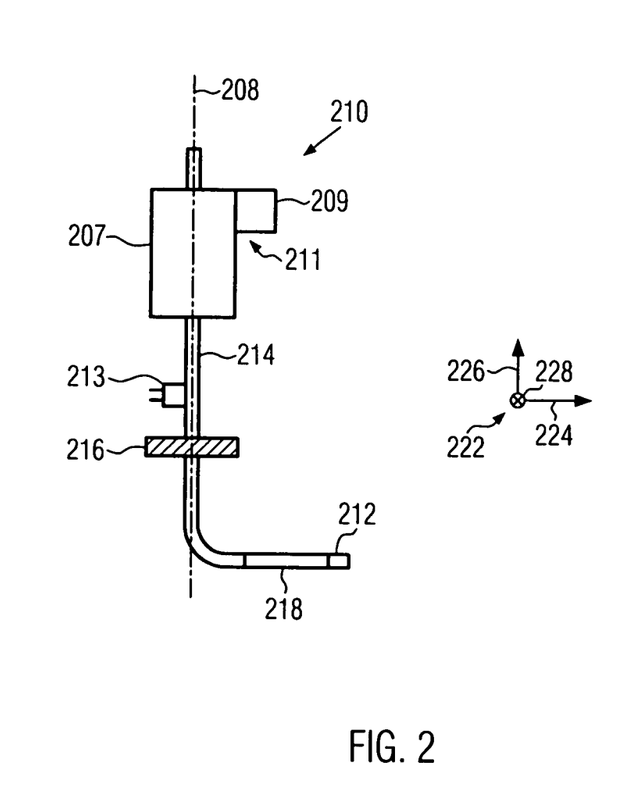
FIG. 2 shows a schematic cross-sectional view of an embodiment of a measuring system.

FIG. 2 shows a schematic cross-sectional view of a measuring system 210. The measuring system 210 includes an actuator 211 comprising a plurality of linear bearings and/or sliding bearings 209. The linear bearings and/or sliding bearings 209 can comprise linear ball bearings and/or linear sliding bearings and/or roller bearings and/or other suitable sliding bearings, so that a linkage 214 is movable along a direction 228.

Direction 228 is oriented normal to the plane of the paper and oriented into the plane of the paper. A direction 224 and a direction oriented 226 are oriented perpendicular to direction 228 where direction 224 and direction 226 are in turn oriented perpendicular to each other and lie in the plane of the paper. Directions 224, 226 and 228 therefore form a tripod 222.

The actuator 211 further comprises a bearing 207 that enables moving the linkage 214 along or against a direction 226. The bearing 207 can comprise a sleeve bearing or a linear ball bearing or a linear sliding bearing or a roller bearing. Furthermore, bearing 207 allows rotation of the linkage 214 about an axis 208. For this, the bearing 207 can comprise a sliding bearing or a shaft or a ball bearing. Any positioning of the sensor assembly 212 in a three-dimensional space volume can therewith be achieved.

The sensor assembly 212 can be composed of at least one thermocouple, the cold junction of which is indicated in FIG. 2 and marked with reference numeral 213. In this, the sensor assembly 212 can comprise at least one type K and/or type N and/or type R and/or type S and/or type B thermocouple. In addition, the sensor assembly can be disposed on a substrate formed of silicon or material having thermal properties similar to silicon. Respective sensor assemblies 212 being disposed on these substrates allow detection of a temperature distribution along a positioning. These detected temperature distributions therefore correspond to temperature distributions that arise on substrates conveyed through devices during the heat treatment. The at least one thermocouple can be disposed on silicon wafer fragments or pieces of material having thermal properties similar to silicon. When using multiple thermocouples, preferably thermocouples of the same kind can be used. The sensor assembly can additionally or alternatively comprise other sensors, such as vibration sensors and/or flow sensors and/or light sensors.

A heat-resistant shielding body 216 is arranged between the actuator 211 and the sensor assembly 212. The heat-resistant shielding body 216 can be arranged between the cold junction 213 and the sensor assembly 212. In this case, the heat-resistant shielding body 216 is used for thermal decoupling of the cold junction 213 and the actuator 211 from the position of the sensor assembly 212. This is of importance for the cold junction 213 to the extent that an electrical potential difference arises between the cold junction 213 and the thermocouples forming the sensor assembly 212. The temperature at the measuring location can be derived from the voltage picked up at the cold junction 213, provided that the temperature at the cold junction is known, as the voltage picked up represents a measure of the difference of the temperature given at the measuring location 212 and the temperature given at the cold junction 213. The heat-resistant shielding body 216 can be made of heat-resistant material such as, for example, a metal. The heat-resistant shielding body 216 can further have a high thermal capacity and/or high thermal conductivity. The heat-resistant shielding body 216 can also comprise a cooling—not shown—by way of a coolant, in order to ensure optimal shielding from high temperatures. The heat-resistant shielding body 116 can further be formed of insulating material having a highly reflective surface, such as ceramic fiber material with a highly reflective surface.

The sensor assembly 212 is further disposed at the end of a telescopically extendable device 218 connected to the actuator 211. The telescopically extendable device 218, with the orientation of the sensor assembly shown in FIG. 2, allows positioning the sensor assembly 212 along or against direction 224. In this, the thermocouple can be designed in part as a coil or a spiral being disposed within the telescopically extendable device 218 or in part surrounding the telescopically extendable device 218, so that an extension of the telescopically extendable device 218 results in an unwinding of the coil or in an elongation of the spiral, and positioning of the sensor assembly along the direction of extension of the telescopically extendable device 218 is possible. In general, the sensor assembly can be radially positioned relative to the axis 208 using the telescopically extendable device 218 if combined with rotations about the axis 208. This makes the measuring system 210 be a versatile system which is able to position the sensor assembly 212 accurately and reproducibly in a measurement volume without restriction. Arbitrary positioning of the sensor assembly 212 in a three-dimensional space volume spanned by the tripod 222 can be achieved.

Figure 3:
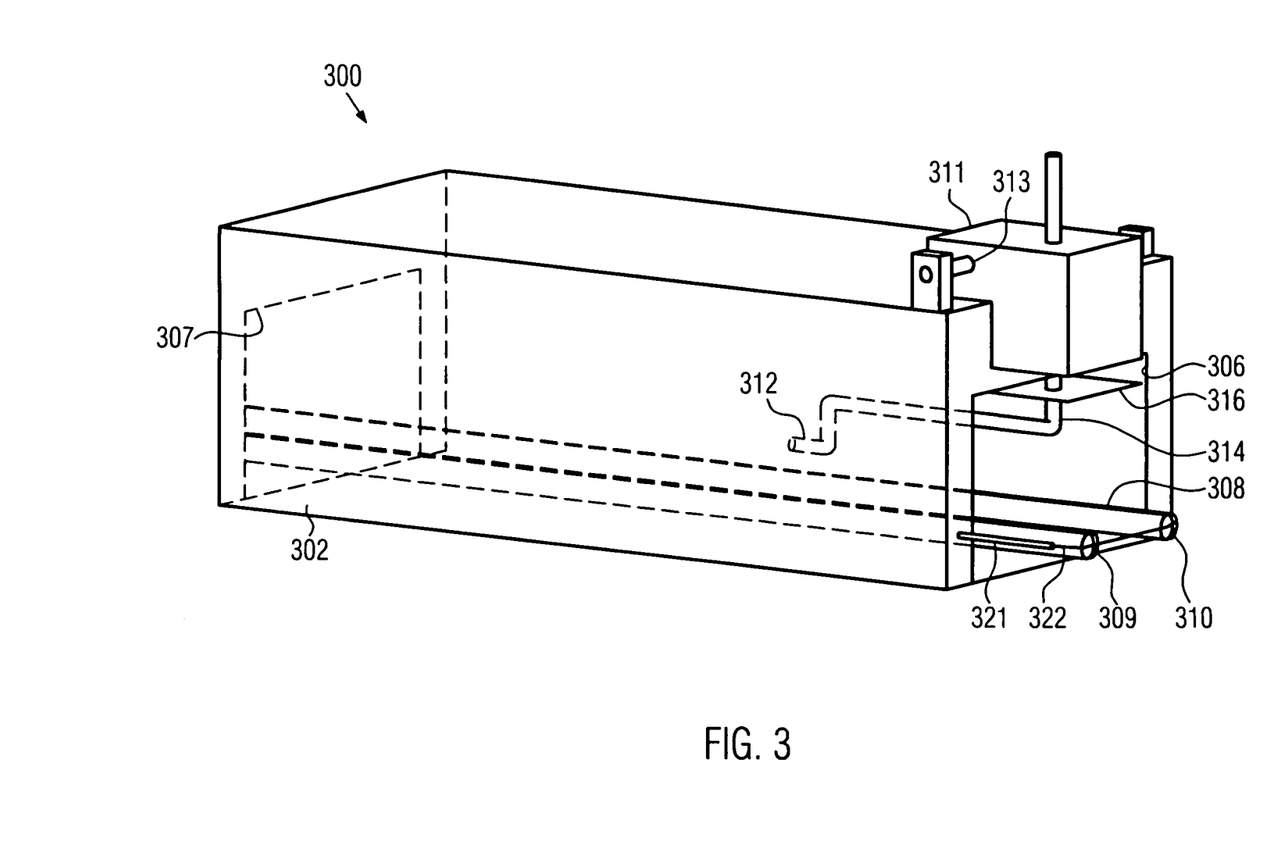
FIG. 3 schematically shows a perspective view of a further embodiment of a device for the heat treatment of substrates according to the present invention.

Another embodiment of a device 300 for the heat treatment of substrates is shown in a perspective view in FIG. 3. The device 300 comprises a heatable chamber 302 with an outlet 306 and an inlet 307. A carrier system 308 is configured as a chain-guided transport system. A first chain 309 extends on one side of the heatable chamber 302 along the direction of passage and a second chain 310 extends along the direction of passage of the heatable chamber 302 at the opposite side. At each end of the transport system, a roller system, being illustrated in FIG. 3 by two rollers, guides the first chain 309 or the second chain 310, respectively, along the direction of passage to the other end of the transport system. The rollers are supported by a rod 322 being mounted with a support 321 to the heatable chamber and maintaining the tension of the chains. A drive system for the carrier system 308 is not shown in FIG. 3 due to the simplified illustration.

At the outlet 306, an actuator 311 is arranged on the heatable chamber 302. Using a shaft guide 313, the actuator 311 can move a linkage 314 along the direction of extension of the shaft guide 313. The actuator 311 can be described like above in analogy to the description of actuator 211 or actuator 111, and reference is made to the respective passages in the description of FIG. 1 and FIG. 2.

The linkage 314 connects the actuator 311 with a sensor assembly 312. A heat-resistant shielding body 316 is arranged between the sensor assembly 312 and the actuator 311 at the height of the outlet 306. The heat-resistant shielding body 316 is made of heat-resistant material and serves shielding or thermally decoupling the components above from the high temperatures within the heatable chamber 302. The heat-resistant shielding body 316 can be designed according to the above-described embodiments, and reference is made to the respective passages in the description of FIGS. 1 and 2.

The linkage 314 has a stepped design below the shielding body 316, at the end of which the sensor assembly 312 is disposed. The stepped configuration of the linkage 314 allows positioning the sensor assembly 312 between the chains 309 and 310, particularly when substrates to be treated are conveyed by the chains. There is therefore no "shadowing" effect from the heat sources in the chamber. Determination of a temperature profile along or against the direction of passage or transverse to the direction of passage can also occur when substrates are passed through the heatable chamber for heat treatment. Operation of the device 300 can thereby be maintained despite measurement data being recorded. The linkage 314 can be a telescopically extendible device (not shown), as described in connection with FIG. 2. For a respective description, reference is made to the respective passages in the description of FIG. 2.

The sensor assembly 312 can be designed according to the sensor assembly 112 and/or the sensor assembly 212 described in connection with FIG. 1 and/or FIG. 2. For a respective description, reference is made to the respective passages in the description of FIG. 1 and/or FIG. 2.

The device 300 can further comprise the data recording and data storage device 130, the control device 140, and the hardware and the software 150 described in connection with FIG. 1, and comprise respective features and devices, as described above.

For a respective description, reference is made to the respective passages in the description of FIG. 1.

The device 300 can further comprise an encoder—not shown—which is configured for determining the position of the sensor assembly 312 relative to a fixed reference point. The encoder can comprise markings which are applied to the device 300 and/or to a control device—not shown—, and/or to the actuator 311. These markings can be formed as markings that can be optically read or read out, and that can be read or read out by the human eye or a suitable read-out device. It is also possible that the encoder is formed by an optical system that detects the position of the sensor assembly by interference from the radiation emitted by the optical system. It is also possible that the encoder emits a directed signal and the position of the sensor assembly can be effected by run-time measurements of the signal. Furthermore, the encoder can be formed by a system comprising an emitter disposed in the vicinity of the sensor assembly and a receiver assembly surrounding the largest possible measuring volume. This data can be outputted to a read-out device that transmits it to a CPU or stores it in a non-volatile memory device. The loss of position caused by a fault in the device 300 can thereby be avoided.

An embodiment of a method for recording measurement data, such as determining a temperature profile, in the device 300 for the heat treatment of substrates shall now be explained with reference to FIG. 3. In the event that determining a position of the sensor assembly 312, which can be performed using an encoder, leads to the result that the sensor assembly 312 is disposed outside the heatable chamber 302, then the sensor assembly 312 is positioned within the heatable chamber 302 at a predetermined position by a control device (not shown in FIG. 3) actuating the actuator 311. Based on a comparison of the measurement data provided by the sensor assembly 312, such as temperature signals, with suitable target data, such as the temperature outside the heatable chamber 302, it can alternatively be decided whether the sensor assembly 312 is located inside or outside the heatable chamber 302.

If no predetermined routine program is started, then a predetermined travel path for positioning the sensor assembly 312 can be selected by a user for actuating the actuator 311 by a control device (not shown in FIG. 3). The travel path is selected according to measurement data to be recorded, for example, a temperature profile to be determined.

During measurement during operation of the heatable chamber 302, substrates to be treated continue to be introduced into the device 300 and conveyed by the conveying system 308 along a direction of passage. The direction of passage is oriented from the inlet 307 towards the outlet 306.

Positioning the sensor assembly 312 within the heatable chamber 302 is performed along the direction of passage and/or transversely to the direction of passage according to a predetermined travel path. In this, data can be recorded at measuring locations being positioned below the plane of the substrates, at the height of the substrates and/or above the substrates. The sensor assembly can be positioned in a "floating" manner above the conveyor system 308. If data is recorded at the height of the substrates or below the substrates, such as a temperature distribution or a temperature profile, respectively, then the sensor assembly 312 is positioned longitudinally along the direction of passage such that the sensor assembly is moved relative to the substrate along the direction of passage. Positioning independent of the positioning along the direction of passage transversely to the direction of passage, for example, along a width of the device 300, can be performed at any speed. This can result, for example, in a zigzag path or in a parabolic or hyperbolic or cycloidal travel path. The positioning moving along longitudinally relative to the direction of passage ensures that the sensor assembly experiences no further positionings relative to the substrates conveyed along the direction of passage and thereby maintains its relative distance relative to the substrates conveyed along or against the direction of passage. Positioning transversely to the direction of passage can also be performed in an accelerated or decelerated manner. Positioning along the direction of passage can be performed in dependency of a conveying speed of the substrates and/or a distance between two consecutively introduced substrates and/or a loading rate. A loading rate can be defined by the reciprocal of a temporal distance at which two directly consecutive substrates are introduced into the device 300.

Reading out and recording measurement signals provided by the sensor assembly 312 is performed during the entrainment of the sensor assembly 312 between two immediately consecutive substrates. Distribution of measurement data, such as a temperature profile and/or a flow profile and/or vibrations, can thereby be recorded within the heatable chamber 302 while substrates are being conveyed.

Alternating positioning and recording of the measurement signals by the sensor assembly 312 between each of two consecutive substrates can be performed in consideration of the conveying speed during a delaying and accelerating movement matched thereto along the direction of passage.

The measurement signals provided by the sensor assembly 312 can be compared with target data. This comparison can serve as a basis for controlling the device 300.

With each positioning of the sensor assembly 312, position data that can be stored in a non-volatile memory device can be simultaneously determined using an encoder.

However, it is also possible to record data, such as temperature profiles, above the substrate plane, where the measurement signals are only recorded when there is no substrate disposed beneath the position of the sensor assembly 312. This means that recording and/or reading out measurement signals provided by the sensor assembly 312 is performed only when each plane perpendicular to the direction of passage, in which a sensor is arranged, is not cut by a substrate. This allows for measurement data, such as temperature distribution, to be recorded in a measurement volume. Reading out and/or recording measurement signals provided by the sensor assembly 312 can occur in dependency of a conveying speed and/or a loading rate of the device 300.

The sensor assembly explained in the preceding embodiments can be formed by a thermocouple, a linear array of thermocouples, or a two-dimensional array of thermocouples. The two-dimensional arrangement of thermocouples can follow a matrix structure in rows and columns. A linear array of thermocouples can be oriented parallel to a direction of passage or transverse to a direction of passage. A linear array of thermocouples and a two-dimensional array of thermocouples increase the number of measurement signals recorded during movement and positioning while simultaneously reducing the overall recording time of a positioning along a predetermined travel path.

Recording measurement data during the conveyance of substrates through the device has been explained on the basis of the above embodiments. However, the present invention is not restricted thereto. Recording measurement data can also occur during a state when the device does not convey any substrates.

In the foregoing embodiments, recording measurement data has also been explained using the example of temperature profile measurements. However, the present invention is not restricted thereto. The person skilled in the art will recognize that the measuring systems described can also measure convection flows and vibration and that respective data can be recorded.

In one of the preceding embodiments, it was explained that recording and/or reading out measurement signals provided by the sensor assembly during measurement above the substrate plane is performed only when there is no substrate disposed beneath the sensor assembly. However, it is also conceivable that measurement signals can be recorded and/or read out also when a substrate is disposed beneath the sensor assembly. This could lead to discriminating influences of the thermal capacity of substrates on recording measurement data within the device.

The present invention has been described in embodiments with respect to a continuous furnace. The person skilled in the art will recognize, however, that the present invention is not restricted to a continuous furnace. For example, the heatable chamber can also be a batch furnace or a furnace with a carrier system, where the heatable chamber comprises only an opening for loading substrates.

The present invention has been described in embodiments with respect to conveying substrates in a single lane. However, the present invention is not restricted thereto. Devices can also comprise multi-lane carrier and/or transport systems.

The present invention has been described in embodiments with respect to a sensor assembly comprising thermocouples. However, the present invention is not restricted thereto. A sensor assembly is also conceivable comprising optical sensors, such as pyrometers, or temperature-dependent electrical resistors.

The present invention has been described in embodiments with respect to a sensor assembly comprising, for example, temperature sensors. However, the present invention is not restricted thereto. A sensor assembly is also conceivable which, in addition or in alternative to a temperature measuring system, comprises at least one vibration sensor and/or at least one flow sensor and/or at least one light sensor.

The present invention has been explained in embodiments to the effect that an actuator is arranged on a chamber and at an inlet or an outlet. However, the present invention is not restricted thereto. One or more actuators can also be arranged at a heatable chamber below an inlet opening and/or outlet opening and/or above an inlet opening and/or an outlet opening. It is also possible that a chamber comprises an additional opening through which a sensor assembly can be moved into the chamber and/or from which it can moved out of the chamber.

The present invention has been explained in embodiments to the effect that an actuator is arranged outside of a chamber. However, the present invention is not restricted thereto. One or more actuators can be disposed within a heatable chamber.

The present invention has been described in embodiments to the effect that a sensor assembly can be moved out of a heatable chamber and into a heatable chamber. However, the present invention is not restricted thereto. One or more sensor assemblies can be also permanently disposed within a heatable chamber.

The present invention has been described in embodiments to the effect that devices for the heat treatment of substrates comprise a measuring system and that measurement data is recorded on the basis of a measuring system. The person skilled in the art will recognize, however, that devices for the heat treatment of substrates can also comprise a plurality of measuring systems and that data can be recorded by a plurality of measuring systems. For example, at least one measuring system can represent at least one temperature measuring system and/or at least one measuring system can represent at least one flow measuring system and/or a measuring system can represent at least one vibration measuring system.

The present invention relates to a device for the heat treatment of substrates and a method for recording measurement data in said device, where the device comprises at least one heatable chamber, a carrier system, a sensor assembly and an actuator that is independent of the carrier system. The carrier system is designed to carry substrates, whereas the sensor assembly is configured for coupling to a data recording and/or data storage device. The actuator is coupled to the sensor assembly and configured to position the sensor assembly within the heatable chamber.

What is claimed is:

1. Device for the heat treatment of substrates, comprising:
   at least one heatable chamber that is a continuous furnace,
   a carrier system being adapted to carry substrates, where said carrier system is formed as a transport system,
   a sensor assembly configured for coupling to a data recording and/or data storage device, wherein said sensor assembly is disposed on a substrate formed of silicon or material having thermal properties similar to silicon,
   an actuator that is independent of said carrier system and coupled to said sensor assembly and is configured to move and position said sensor assembly within said heatable chamber; and
   a control device which is configured for electro-mechanical control of said actuator, so that said sensor assembly can be moved and positioned along at least one predetermined travel path,
   where said at least one predetermined travel path extends along a direction which is oriented perpendicular to a direction of passage, and perpendicular to a substrate surface of substrates carried by the carrier system.

2. Device according to claim 1, where said travel path further extends along a direction which is oriented parallel or antiparallel to a direction of passage.

3. Device according to claim 1, where said control device is configured to continuously move said sensor assembly.

4. Device according to claim 1, where said control device is configured to move said sensor assembly stepwise.

5. Device according to claim 1, where said carrier system is formed as a chain-guided transport system.

6. Device according to claim 1, further comprising a telescopically extendable device, at the one end of which said sensor assembly is arranged and which is connected to said actuator.

7. Device according to claim 1, where said sensor assembly comprises at least one temperature sensor and/or at least one vibration sensor and/or at least one flow sensor and/or at least one light sensor.

8. Device according to claim 7, where said sensor assembly comprises a thermocouple.

9. Device according to claim 7, where said sensor assembly comprises a linear array of thermocouples.

10. Device according to claim 7, where said sensor assembly comprises a two-dimensional array of thermocouples in a plane.

11. Device according to claim 1, where a heat-resistant shielding body is arranged between said actuator and said sensor assembly.

12. Device according to claim 1, where said actuator is configured to rotate said sensor assembly about an axis.

13. Device according to claim 1, where said actuator comprises an XYZ linear positioning system.

14. Device according to claim 1, where said actuator comprises at least one linear bearing and/or one sliding bearing.

15. Device according to claim 1, further comprising an encoder that is configured to determine the positions of said sensor assembly.

16. Device according to claim 1, where said actuator is disposed at an inlet and/or outlet of at least one heatable chamber and said sensor assembly can be moved into said chamber or be moved out of said chamber.

17. Device according to claim 1, where said device is a drying and/or firing device in a metallization device for the production of solar cells or is a hybrid furnace.

18. Method for recording measurement data in a device for the heat treatment of substrates according to claim 1, said method comprising:
   introducing substrates to be treated into said device,
   conveying said substrates along a direction of passage, and
   positioning said sensor assembly within said heatable chamber,
   wherein said sensor assembly is positioned longitudinally along said direction of passage and/or transverse to said direction of passage.

19. Method according to claim 18, wherein positioning longitudinally along said direction of passage is effected such that said sensor assembly is moved with said substrates to be conveyed along said direction of passage.

20. Method according to claim 18, wherein reading-out and/or recording at least one measurement signal provided by said sensor assembly is performed as long as said sensor assembly is positioned between two immediately consecutive substrates.

21. Method according to claim 18, wherein positioning said sensor assembly and reading-out and/or recording at least one measurement signal provided by said sensor assembly is performed alternatingly.

22. Method according to claim 18, further comprising:
controlling said device in dependency of at least one measurement signal provided by said sensor assembly.

23. Method according to claim 18, further comprising:
determining the position of said sensor assembly, and
storing position data of said sensor assembly in a non-volatile memory device.

\* \* \* \* \*